United States Patent
Huang et al.

(10) Patent No.: US 7,378,792 B2
(45) Date of Patent: May 27, 2008

(54) LIGHT-EMITTING DEVICE

(75) Inventors: Chen Yang Huang, Hsinchu County (TW); Cheng Wei Chu, Taipei County (TW); Chu Li Chao, Hsinchu (TW); Jim Yong Chi, Taichung (TW)

(73) Assignee: Industrial Technology Research Institute, Hsinchu County (TW)

( * ) Notice: Subject to any disclaimer, the term of this patent is extended or adjusted under 35 U.S.C. 154(b) by 0 days.

(21) Appl. No.: 11/554,891

(22) Filed: Oct. 31, 2006

(65) Prior Publication Data
US 2008/0042546 A1    Feb. 21, 2008

(30) Foreign Application Priority Data
Aug. 16, 2006    (TW) .............................. 95130057 A

(51) Int. Cl.
*H05B 33/00* (2006.01)
(52) U.S. Cl. .................... 313/512; 313/113; 313/498; 362/800; 362/341
(58) Field of Classification Search ............. 313/495
See application file for complete search history.

(56) References Cited

U.S. PATENT DOCUMENTS

| | | | | |
|---|---|---|---|---|
| 4,733,335 A | * | 3/1988 | Serizawa et al. ............ 362/503 |
| 4,843,280 A | * | 6/1989 | Lumbard et al. ............ 313/500 |
| 5,043,716 A | * | 8/1991 | Latz et al. ..................... 345/82 |
| 5,813,753 A | * | 9/1998 | Vriens et al. ................ 362/293 |
| 5,998,925 A | * | 12/1999 | Shimizu et al. ............. 313/503 |
| 7,084,434 B2 | * | 8/2006 | Erchak et al. ................. 257/98 |
| 7,184,111 B2 | * | 2/2007 | Chua et al. .................... 349/71 |
| 2001/0010449 A1 | * | 8/2001 | Chiu et al. ................... 313/501 |
| 2004/0252509 A1 | * | 12/2004 | Lin ............................. 362/293 |
| 2006/0002150 A1 | * | 1/2006 | Kim ............................ 362/627 |
| 2006/0060868 A1 | * | 3/2006 | Orita ............................ 257/84 |
| 2006/0145172 A1 | * | 7/2006 | Su et al. ....................... 257/98 |
| 2007/0064407 A1 | * | 3/2007 | Huang et al. ................. 362/19 |

* cited by examiner

*Primary Examiner*—Ashok Patel
(74) *Attorney, Agent, or Firm*—WPAT, PC; Anthony King

(57) ABSTRACT

A light-emitting device of high light extraction efficiency comprises a first substrate, a light-emitting chip positioned on the first substrate and configured to emit light beams, a fluorescent material positioned on the light-emitting chip, a photonic crystal positioned on the fluorescent material and a reflector positioned on the photonic crystal and configured to reflect the light beam to the fluorescent material. The first substrate is preferably a metallic cup, and the light-emitting chip is positioned at the bottom of the metallic cup. The photonic crystal includes a second substrate and a plurality of protrusions positioned on the second substrate. Each of the protrusions includes a bottom end positioned on the second substrate and a tip portion smaller than the bottom end. The plurality of protrusions can be triangular pillars, semicircular pillars, sinusoid pillars, pyramids, or cones.

13 Claims, 5 Drawing Sheets

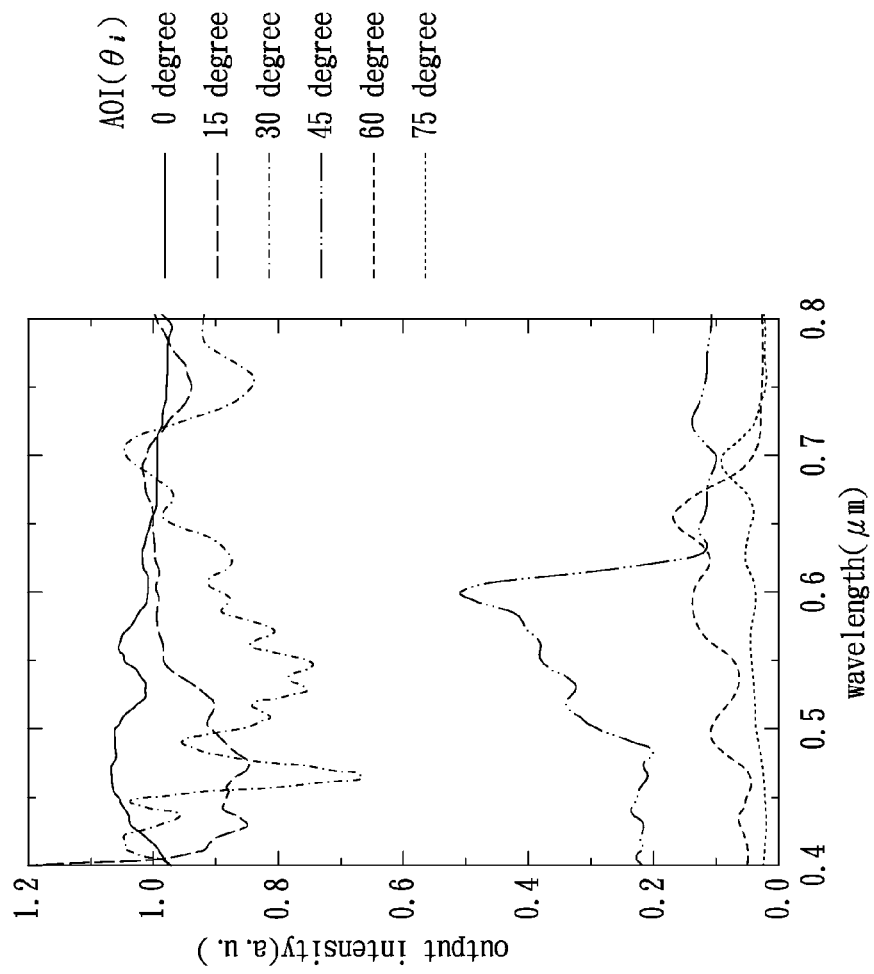
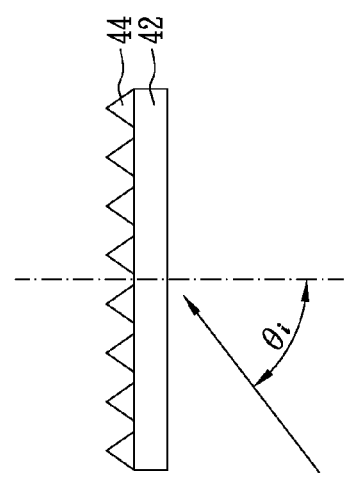
FIG. 10(a)
FIG. 10(b)

LIGHT-EMITTING DEVICE

BACKGROUND OF THE INVENTION (A) Field of the Invention

The present invention relates to a light-emitting device, and more particularly, to a light-emitting device having a concave-convex photonic crystal and a reflector.

(B) Description of the Related Art

FIG. 1 shows a conventional light-emitting device 10. The light-emitting device 10 includes a substrate 12, a light-emitting chip 14 positioned on the substrate 12, a fluorescent material (with a refractive index of 1.5-1.6) 16 positioned on the light-emitting chip 14, and a transparent cover (with a refractive index of 1.5) 18. Light beams 20 (e.g., an ultraviolet light) can excite the fluorescent material (e.g., RGB fluorescent material) 16 to emit excited light beams 22, i.e., red, green and blue light beams, which are mixed to form a white light 24. The light beams 20 produced by the light-emitting chip 14 must pass through the fluorescent material 16 and the transparent cover 18, and then can propagate outside the light-emitting device 10, for example, propagate to the air (with a refractive index of 1).

FIGS. 2(a) and 2(b) show the simulated output light intensity of a conventional light-emitting device 10. If the incident angle ($\theta_i$) of the excited light beams 22 irradiated into the transparent cover 18 is larger than 45 degrees, the simulated output light intensity of the light-emitting device 10 is quite low (less than 0.05). As the excited light beams 22 are propagated from a high-refractive-index material to a low-refractive-index material, internal total reflection and high index waveguide losses occur. The internal total reflection causes the excited light beams 22 having an incident angle larger than the critical angle (about 45 degrees) to reflect completely back to the interior of the light-emitting device 10 by the transparent cover 18, and cannot be propagated outside the light-emitting device 10. In other words, most of the excited light beams 22 are reflected or absorbed inside the light-emitting device 10, which leads to serious losses such that the light output efficiency of the light-emitting device 10 is quite low.

SUMMARY OF THE INVENTION

One aspect of the present invention provides a light-emitting device, which uses a photonic crystal of a protrusion and depression structure to prevent internal total reflection, and uses a reflector to reflect ultraviolet light produced by a light-emitting chip to a fluorescent material, so as to output white light only.

The light-emitting device according to this aspect comprises a first substrate, a light-emitting chip positioned on the first substrate and configured to emit light beams, a fluorescent material positioned on the light-emitting chip, a photonic crystal positioned on the fluorescent material, and a reflector positioned on the photonic crystal and configured to reflect the light beams to the fluorescent material.

The conventional light-emitting device reflected or absorbed most of the excited light beams produced by the fluorescent material inside the light-emitting device, which leads to serious losses such that the light output efficiency of the light-emitting device is quite low. In contrast, the present invention employs a photonic crystal having a plurality of protrusions positioned in the light-emitting device to prevent total internal reflection of the excited light produced by the fluorescent material, thereby increasing the extraction efficiency of the excited light beams.

BRIEF DESCRIPTION OF THE DRAWINGS

The objectives and advantages of the present invention will become apparent upon reading the following description and upon reference to the accompanying drawings in which:

FIGS. 10(a) and 10(b) show the simulated output light intensity of the light-emitting device of high light output efficiency according to one embodiment of the present invention.

DETAILED DESCRIPTION OF THE INVENTION

Figure 1:
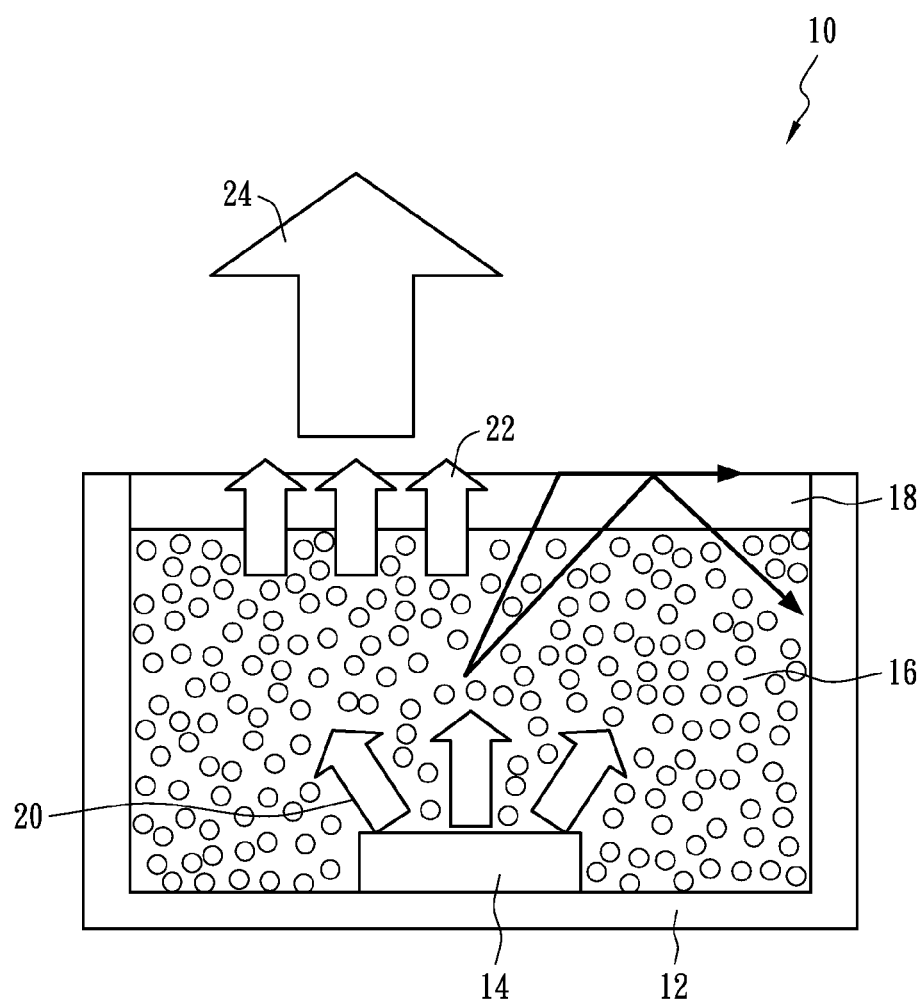
FIG. 1 shows a conventional light-emitting device.
Figure 2B:
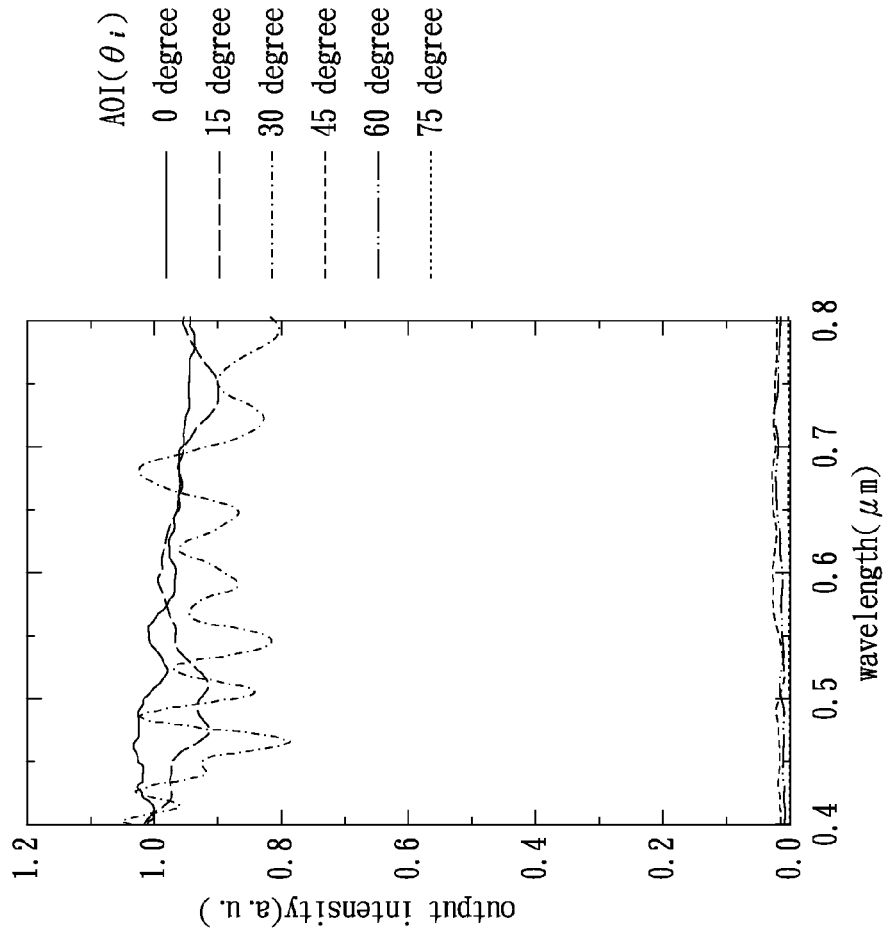
FIGS. 2(a) and 2(b) show the simulated output light intensity of a conventional light-emitting device.
Figure 2A:
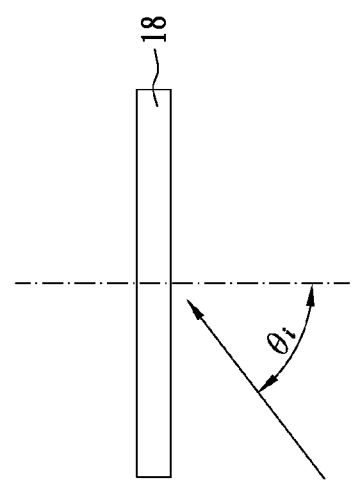
Figure 3:
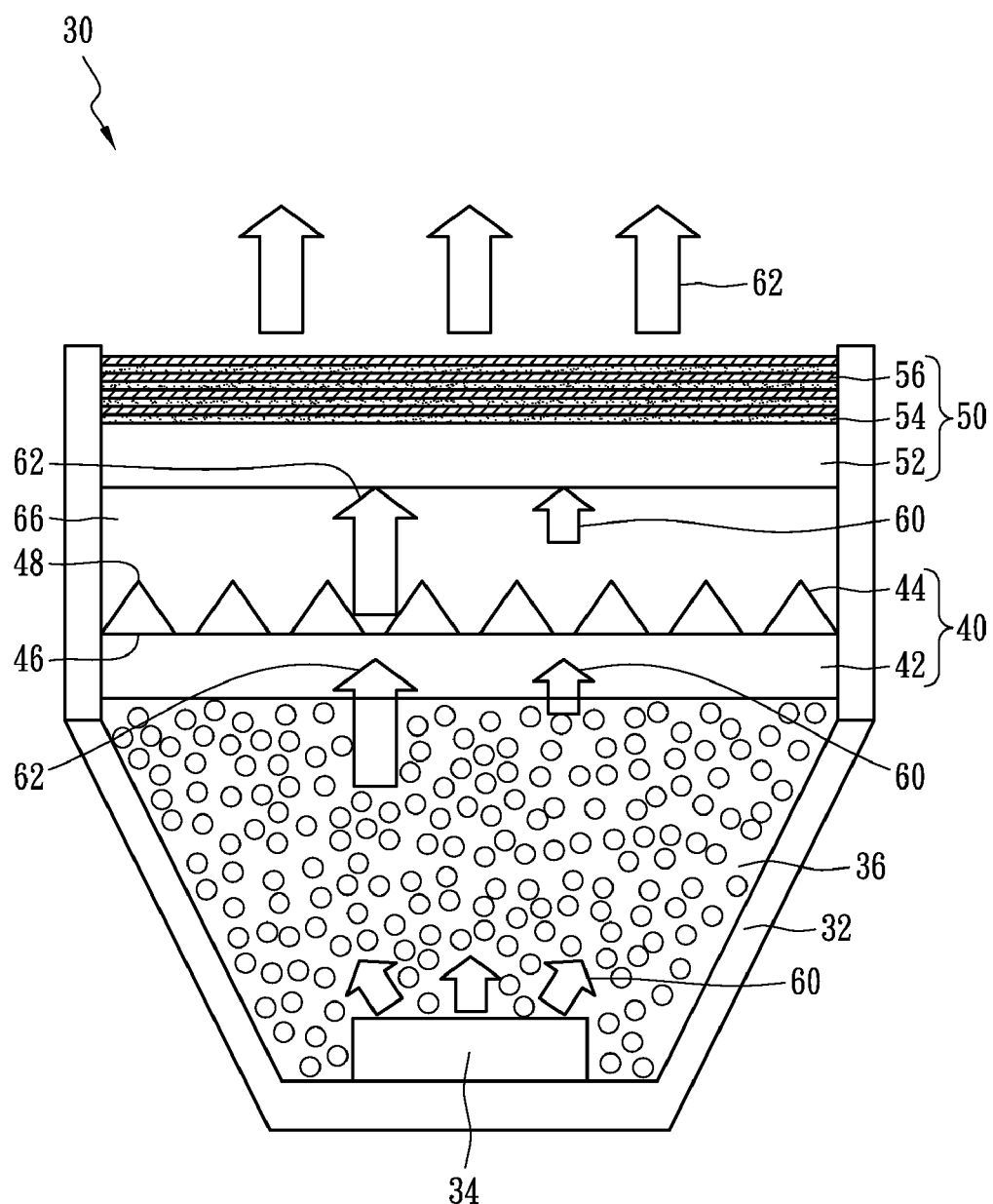
FIG. 3 shows a light-emitting device of high light output efficiency according to one embodiment of the present invention.

FIG. 3 shows a light-emitting device 30 of high light output efficiency according to one embodiment of the present invention. The light-emitting device 30 of high light output efficiency includes a substrate 32, a light-emitting chip 34 such as a LED (light-emitting diode) chip positioned on the substrate 32 and configured to emit ultraviolet light beams 60, a fluorescent material 36 positioned on the light-emitting chip 34, a photonic crystal 40 positioned on the fluorescent material 36, and an omni-directional reflector 50 positioned on the photonic crystal 40 and configured to reflect the ultraviolet light beams 60 to the fluorescent material 36. An air gap 66 having a refractive index of 1 exists between the photonic crystal 40 and the omni-directional reflector 50. Preferably, the fluorescent material 36 covers the light-emitting chip 34.

The ultraviolet light beams 60 emitted from the light-emitting chip 34 excite the fluorescent material (e.g., yttrium aluminum garnet) 36 to emit excited light beams (e.g., red, green and blue light beams) 62. The excited light beams pass through the photonic crystal 40, the air gap 66, and the omni-directional reflector 50, and propagate to the outside of the light-emitting device 30. The substrate 32 is preferably a metallic cup, and the light-emitting chip 34 is positioned at the bottom of the metallic cup. In addition, the light-emitting device 30 can also include a plurality of light-emitting chips 34 positioned on the substrate 32.

The omni-directional reflector 50 includes a transparent substrate 52 and a plurality of first films 54 and second films 56 alternately laminated on the transparent substrate 52, in which the refractive index of the first films 54 is larger than that of the second films 56. The transparent substrate 52 can be a glass substrate or a plastic substrate made of polycarbonate having a refractive index of 1.51. The first films 54 can be made of material selected from the group consisting of titanium oxide, tantalum oxide, niobium oxide, cerium oxide and zinc sulphide, and the second film 56 can be made of material selected from the group consisting of silicon oxide, silicon nitride, aluminum oxide and magnesium fluoride. The film structure of the reflector 50 is designed to selectively reflect the ultraviolet light beams 60 emitted from the light-emitting chip 34 to the fluorescent material 36, but allow the excited light beams 62 produced by the fluorescent material 36 to pass through. Consequently, the ultraviolet light beams 60 are limited to the interior of the light-emitting device 30, so as to excite the fluorescent material 36 to produce the excited light beams 62 as much as possible to improve the internal conversion efficiency and prevent the ultraviolet light beams 60 from propagating to the outside of the light-emitting device 30.

Figure 4:
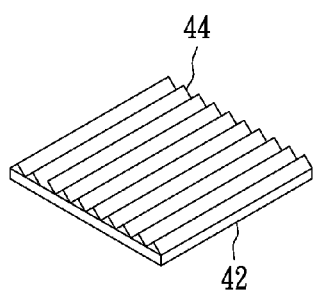
FIGS. 4-9 show the photonic crystal according to one embodiment of the present invention.
Figure 5:
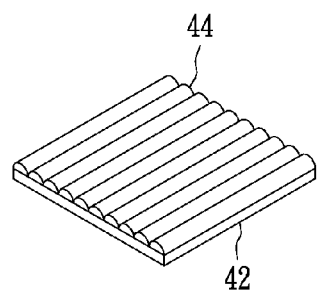
Figure 6:
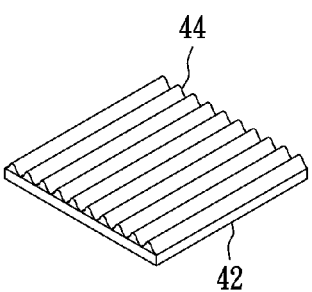
Figure 7:
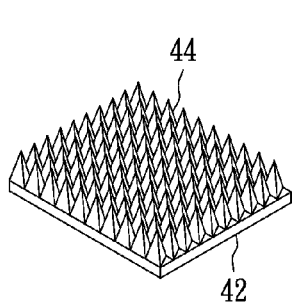
Figure 8:
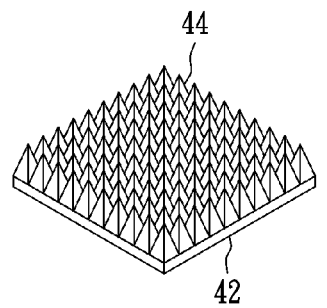
Figure 9:
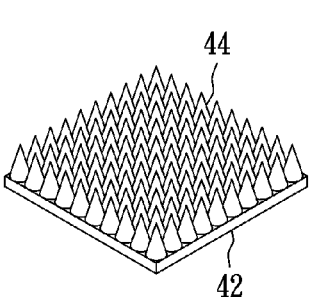

FIGS. 4-9 show the photonic crystal 40 according to one embodiment of the present invention. The photonic crystal 40 includes a transparent substrate (e.g., a glass substrate with a refractive index of 1.51) 42 and a plurality of protrusions 44 positioned on the transparent substrate 42. Each of the protrusions 44 includes a bottom end 46 positioned on the transparent substrate 42 and a tip portion 48 smaller than the bottom end 46. The transparent substrate 42 can be a glass substrate or a plastic substrate made of polycarbonate having a refractive index of 1.51. The plurality of protrusions 44 can be triangular pillars (as shown in FIG. 4), semicircular pillars (as shown in FIG. 5), sinusoid pillars (as shown in FIG. 6), triangular pyramids (as shown in FIG. 7), quadrangular pyramids (as shown in FIG. 8) or cones (as shown in FIG. 9). Though the plurality of protrusions 44 are arranged in a continuous arrangement as shown in FIGS. 7-9, the plurality of protrusions 44 can also be arranged in a discontinuous rectangular, triangular, hexagonal or random manner.

FIGS. 10(a) and 10(b) show the simulated output light intensity of the light-emitting device 30 and high light output efficiency according to one embodiment of the present invention. When the incident angle ($\theta_i$) of the excited light beams 62 irradiated into the transparent substrate 42 of the photonic crystal 40 is greater than 45 degrees, the simulated output light intensity of the light-emitting device 30 is obviously larger than the light output intensity (less than 0.05) of the conventional light-emitting device 10. The photonic crystal 40 of the light-emitting device 30 has a plurality of protrusions 44 capable of preventing total internal reflection. Therefore, the excited light beams 62 produced by the fluorescent material 36 can propagate to the outside of the light-emitting device 30 via the photonic crystal 40, and will not be reflected to the fluorescent material 36 due to the is total internal reflection, and thus a higher simulated output light intensity is obtained.

Conventional light-emitting devices 10 reflect or absorb most of the excited light beams 22 produced by the fluorescent material 16 inside the light-emitting device 10, which leads to serious losses such that the light output efficiency of the light-emitting device 10 is quite low. In contrast, the present invention employs a photonic crystal 40 having a plurality of protrusions 44 positioned in the light-emitting device 30 to prevent total internal reflection of the excited light beam 62 produced by the fluorescent material 36, thereby increasing the extraction efficiency of the excited light beams 62.

The above-described embodiments of the present invention are intended to be illustrative only. Numerous alternative embodiments may be devised by those skilled in the art without departing from the scope of the following claims.

What is claimed is:

1. A light-emitting device, comprising:
    a first substrate;
    at least one light-emitting chip positioned on the first substrate for emitting light beams;
    a fluorescent material positioned on the light-emitting chip;
    a photonic crystal positioned on the fluorescent material such that the light beams emitted by the light-emitting chip must first pass through the fluorescent material before reaching the photonic crystal; and
    a reflector positioned on the photonic crystal and configured to reflect the light beams to the fluorescent material.

2. The light-emitting device as claimed in claim 1, wherein the photonic crystal comprises:
    a second substrate; and
    a plurality of protrusions positioned on the second substrate.

3. The light-emitting device as claimed in claim 2, wherein the second substrate is made of material selected from the group consisting essentially of glass and plastic.

4. The light-emitting device as claimed in claim 2, wherein the protrusion comprises:
    a bottom end positioned on the second substrate; and
    a tip portion smaller than the bottom end.

5. The light-emitting device as claimed in claim 2, wherein at least some of the protrusions in the plurality of protrusions have a shape selected from the group consisting of triangular pillars, semicircular pillars, sinusoid pillars, triangular pyramids, quadrangular pyramids, and cones.

6. The light-emitting device as claimed in claim 2, wherein the plurality of protrusions are arranged in a configuration selected from at least one member of the group consisting of rectangular, a triangular, a hexagonal, and a random manner.

7. The light-emitting device as claimed in claim 1, wherein the reflector comprises:
    a third substrate;
    a plurality of first films and second films alternately laminated; and
    wherein the plurality of first films and second films is disposed on the third substrate.

8. The light-emitting device as claimed in claim 7, wherein the third substrate is made of material selected from the group consisting essentially of glass and plastic.

9. The light-emitting device as claimed in claim 7, wherein the refractive index of the first film is larger than the refractive index of the second film.

10. The light-emitting device as claimed in claim 7, wherein the first film is made of material selected from the group consisting of titanium oxide, tantalum oxide, niobium oxide, cerium oxide and zinc sulphide.

11. The light-emitting device as claimed in claim 7, wherein the second film is made of material selected from the group consisting of silicon oxide, silicon nitride, aluminum oxide and magnesium fluoride.

12. The light-emitting device as claimed in claim 10 further comprising an air gap disposed between the photonic crystal and the reflector.

13. The light-emitting device as claimed in claim 1, wherein the first substrate is a metallic cup.

* * * * *